United States Patent
Butler et al.

(10) Patent No.: US 9,229,339 B2
(45) Date of Patent: Jan. 5, 2016

(54) POSITIONING SYSTEM, A LITHOGRAPHIC APPARATUS AND A METHOD FOR POSITIONAL CONTROL

(75) Inventors: Hans Butler, Best (NL); Henrikus Herman Marie Cox, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1077 days.

(21) Appl. No.: 13/301,505

(22) Filed: Nov. 21, 2011

(65) Prior Publication Data

US 2012/0127451 A1 May 24, 2012

Related U.S. Application Data

(60) Provisional application No. 61/416,174, filed on Nov. 22, 2010.

(51) Int. Cl.
 *G03F 7/20* (2006.01)
 *G03B 27/53* (2006.01)
 *G03B 27/58* (2006.01)

(52) U.S. Cl.
 CPC ............ *G03F 7/70725* (2013.01); *G03B 27/53* (2013.01); *G03B 27/58* (2013.01)

(58) Field of Classification Search
 CPC . G03F 7/709; G03F 7/70725; G03F 7/70758; G03F 7/70775; G05B 2219/45028; G05B 19/402; G05B 2219/42017
 USPC ................................. 318/652; 700/53, 60, 114
 See application file for complete search history.

(56) References Cited

U.S. PATENT DOCUMENTS

| | | | |
|---|---|---|---|
| 5,696,590 A * | 12/1997 | Makita | 356/399 |
| 6,373,072 B1 | 4/2002 | Butler et al. | |
| 7,782,446 B2 | 8/2010 | Kamidi et al. | |
| 2004/0207824 A1 | 10/2004 | Lof et al. | |
| 2006/0038968 A1 | 2/2006 | Kemper et al. | |
| 2006/0139598 A1* | 6/2006 | Van Dijsseldonk et al. | 355/67 |
| 2008/0212046 A1 | 9/2008 | Riepen et al. | |
| 2008/0212054 A1 | 9/2008 | Kamidi et al. | |
| 2009/0141259 A1* | 6/2009 | Shibayama | 355/72 |
| 2009/0262318 A1 | 10/2009 | Van Den Dungen et al. | |

FOREIGN PATENT DOCUMENTS

| | | | |
|---|---|---|---|
| EP | 0967525 A | 12/1999 | |
| EP | 1265104 A | 6/2001 | |
| JP | 2000-031049 | 1/2000 | |

(Continued)

OTHER PUBLICATIONS

Japanese Office Action mailed Nov. 20, 2012 in corresponding Japanese Patent Application No. 2011-249222.

*Primary Examiner* — Steven H Whitesell Gordon
(74) *Attorney, Agent, or Firm* — Pillsbury Winthrop Shaw Pittman LLP

(57) ABSTRACT

A positioning system for controlling a relative position between a first component and a second component of a lithographic apparatus, wherein a position of each component is defined by a set of orthogonal coordinates, the positioning system including: a measuring device configured to determine an error in the momentary position of one of the components with respect to a setpoint position in a measurement coordinate; and a controller configured to control movement of the other component in a control coordinate based on the determined error; wherein the measurement coordinate is different from the control coordinate.

9 Claims, 7 Drawing Sheets

(56) References Cited

FOREIGN PATENT DOCUMENTS

| JP | 2003-197509 | 7/2003 |
| JP | 2008-219001 | 9/2008 |
| TW | 394862 | 6/2000 |
| TW | 200846840 | 12/2008 |

* cited by examiner

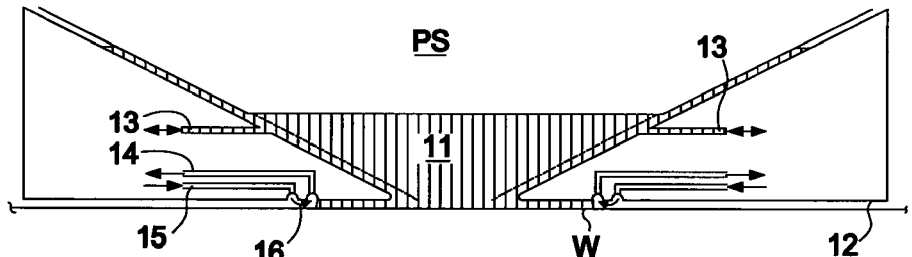
FIG. 5
FIG. 6
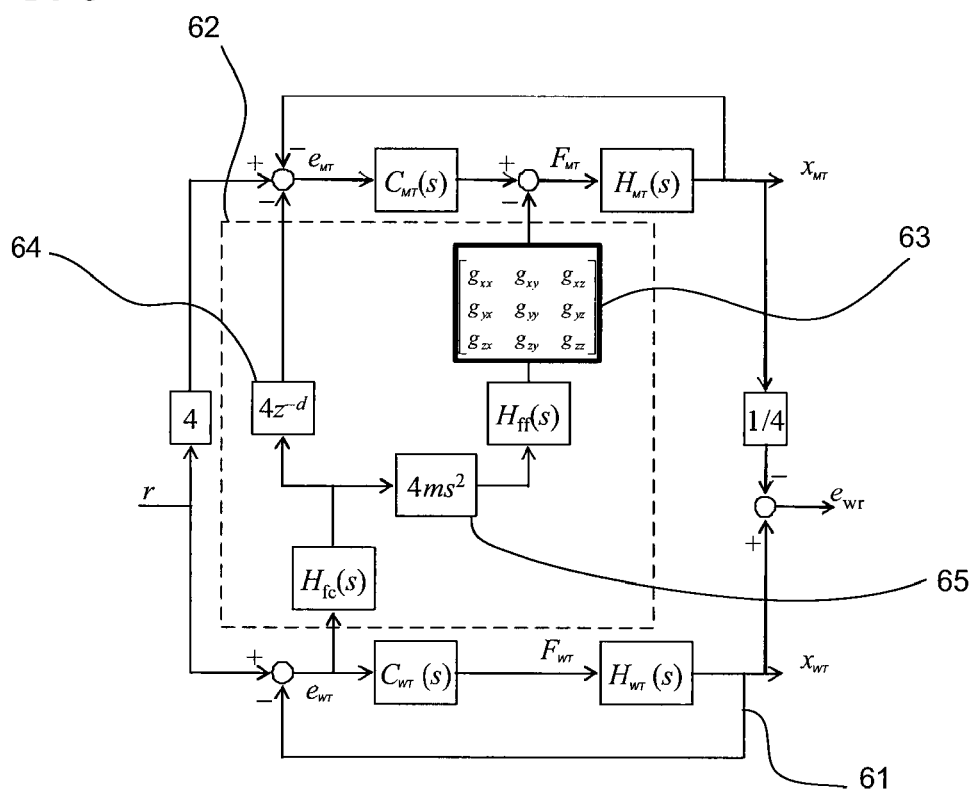

POSITIONING SYSTEM, A LITHOGRAPHIC APPARATUS AND A METHOD FOR POSITIONAL CONTROL

CROSS REFERENCE TO RELATED APPLICATIONS

This application claims priority and benefit under 35 U.S.C. §119(e) to U.S. Provisional Patent Application No. 61/416,174, entitled "A Positioning System, A Lithographic Apparatus And A Method For Positional Control," filed on Nov. 22, 2010. The content of that application is incorporated herein in its entirety by reference.

FIELD

The present invention relates to a positioning system, a lithographic apparatus, a method for controlling a relative position between a superior component and an inferior component of a lithographic apparatus and a method for controlling a relative position between a support structure constructed to support a patterning device and a substrate table constructed to hold a substrate of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

The manufacture of ICs and other devices with such apparatus generally involves the replication of extremely fine submicron patterns, with an exceptionally high degree of positional accuracy. For this reason, it is essential to properly isolate various critical parts of the apparatus such as the substrate table and support structure (i.e. mask table), for example, from spurious motion, vibration, mechanical shocks, etc. In general, this is achieved using such measures as carefully designed metrology frames, air-mounts, motional counterweights and dampers, which serve to isolate the critical parts of the apparatus from most unwanted mechanical influences. However, such measures are not completely effective in eliminating a number of unwanted influences, such as, for example:

1. vibrations in the substrate table due to leveling actions during exposure;
2. vibrations caused by motion of reticle masking blades;
3. resonance effects caused by the presence of air showers;
4. immersion forces caused by water flow between the projection system and the substrate;
5. vibrations in the substrate table caused by motion of the support structure, and vice versa; and
6. influence of air shower flow on the substrate table.

Although these effects are relatively small, they become increasingly important as the need to produce ever-higher device resolutions increases, and they now form a substantial barrier to the viable realization of large-area ICs having critical dimensions of the order of 0.15 µm and less.

Accordingly, it has been proposed in EP-0 967 525-A to provide a control system for the substrate table and support structure of a lithographic apparatus in which errors in the position of the substrate table are compensated for by their inclusion as a feed-forward control in the support structure control loop. Specifically, the substrate table error is lowpass filtered, the output of the filter is then added to the support structure setpoint, and also twice differentiated, multiplied by the support structure mass and the resultant force applied to the support structure. This proposal is based on the realization that the absolute positions of the support structure and substrate table are less important than their relative position and allows the correction of substrate table errors beyond the support structure bandwidth. However, this control system has performance limits, in part caused by the inevitable time delay in processing the substrate table error.

It has been proposed in EP-1 265 104-A to provide a control system for the mask table (patterning means) and substrate table that predicts the momentary substrate table position error and feeds it into the mask table control loop, adding it to the mask table set point and as a force to the mask table.

SUMMARY

Support structure and substrate table positioning accuracy requirements are becoming more severe due to increased requirements on critical dimension and overlay. Forces acting on the support structure due to the feed-through substrate table position error can have detrimental effects on positioning error of the patterning device (e.g. mask). For example, the forces can cause streaking and overlay problems, particularly if the feed-through forces are relatively large.

It is desirable, for example, to provide an improved positioning system for inferior and superior components (e.g. the support structure for the patterning means and the substrate table) of a lithographic apparatus.

According to an aspect of the invention, there is provided a positioning system for controlling a relative position between a superior component and an inferior component of a lithographic apparatus, wherein a position of each component is defined by a set of orthogonal coordinates, the positioning system comprising:

a measuring device configured to determine an error in the momentary position of one of the components with respect to a setpoint position in a measurement coordinate; and a controller configured to control movement of the other component in a control coordinate based on the determined error;

wherein the measurement coordinate is different from the control coordinate.

According to an aspect of the invention, there is provided a positioning system for controlling a relative position between a superior component and an inferior component of a lithographic apparatus, the positioning system comprising:

a compensatory measuring device configured to determine a compensated error in the momentary position of one of the components with respect to a setpoint position, wherein the compensated error excludes from the actual error an error component due to at least one frequency component of movement of said one of the inferior component and superior component; and an uncompensatory measuring device configured to determine an uncompensated error in the momentary position of one of the components with respect to said setpoint position, wherein the uncompensated error includes said error component due to said at least one frequency component of movement of said one of the inferior component and superior component.

According to an aspect of the invention, there is provided a lithographic apparatus comprising:

a support structure constructed to support a patterning device;

a substrate table constructed to hold a substrate; and a positioning system for controlling a relative position between the support structure and the substrate table, wherein the support structure and the substrate table define substantially parallel x-y planes, the positioning system comprising:

a measuring device configured to determine an error in the momentary position of the substrate table with respect to a setpoint position in the z direction; and a controller configured to control movement of the support structure based on the determined error.

According to an aspect of the invention, there is provided a method for controlling a relative position between a superior component and an inferior component of a lithographic apparatus, wherein a position of each component is defined by a set of orthogonal coordinates, the method comprising:

determining an error in the momentary position of one of the components with respect to a setpoint position in a measurement coordinate; and controlling movement of the other component in a control coordinate based on the determined error;

wherein the measurement coordinate is different from the control coordinate.

According to an aspect of the invention, there is provided a method for controlling a relative position between a superior component and an inferior component of a lithographic apparatus, the method comprising:

determining a compensated error in the momentary position of one of the components with respect to a setpoint position, wherein the compensated error excludes from the actual error an error component due to at least one frequency component of movement of said one of the inferior component and superior component; and determining an uncompensated error in the momentary position of said one of the components with respect to said setpoint position, wherein the uncompensated error includes said error component due to said at least one frequency component of movement of said one of the inferior component and superior component.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts, in cross-section, a barrier member which may be used in an embodiment of the present invention as an immersion liquid supply system;

FIG. 6 is a control theory circuit according to an embodiment of the invention;

DETAILED DESCRIPTION

Figure 1:
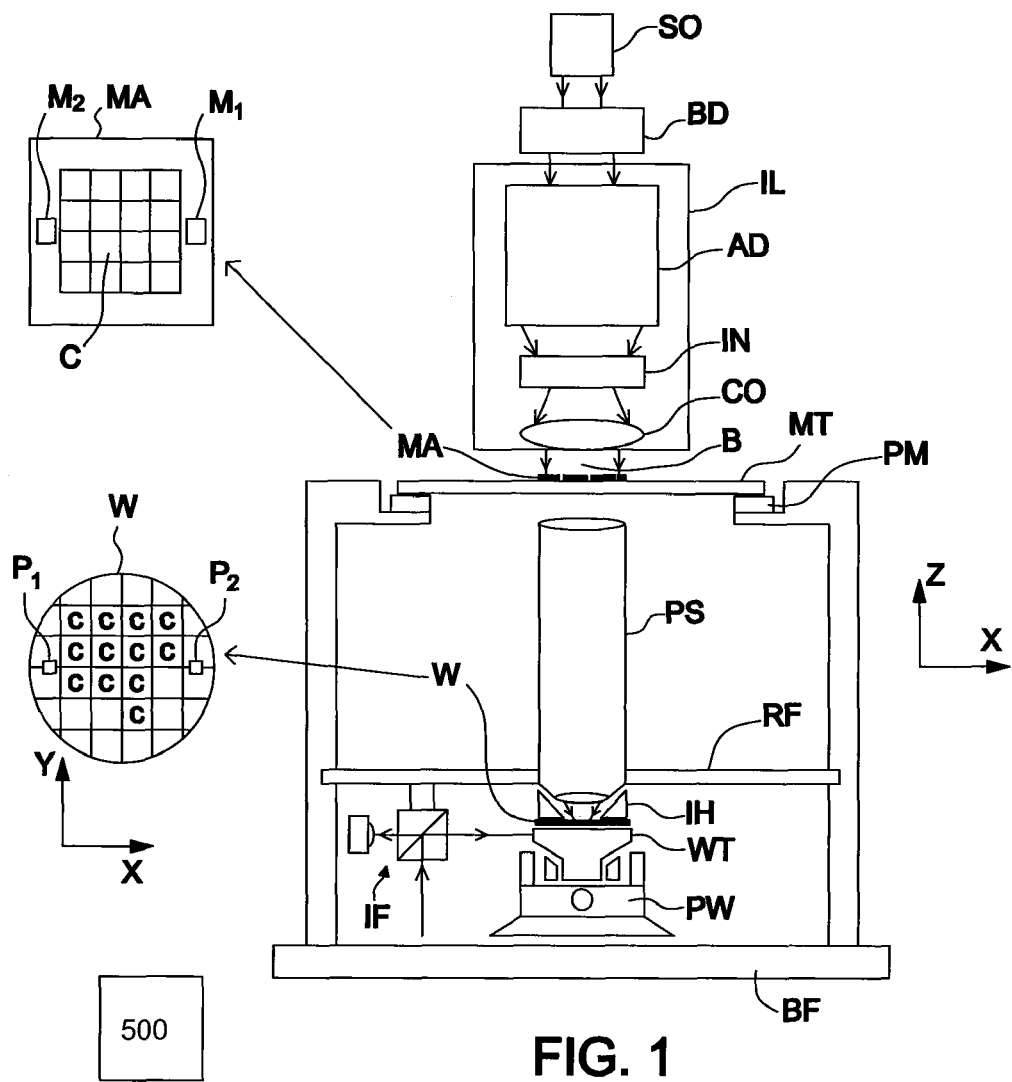
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e.

a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatus a fluid, in particular a liquid, is provided between the final element of the projection system to enable imaging of smaller features and/or increase the effective NA of the apparatus. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. An embodiment of the invention is described further below with reference to such an immersion apparatus, but may equally be embodied in a non-immersion apparatus. Arrangements for providing liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5.

Figure 2:
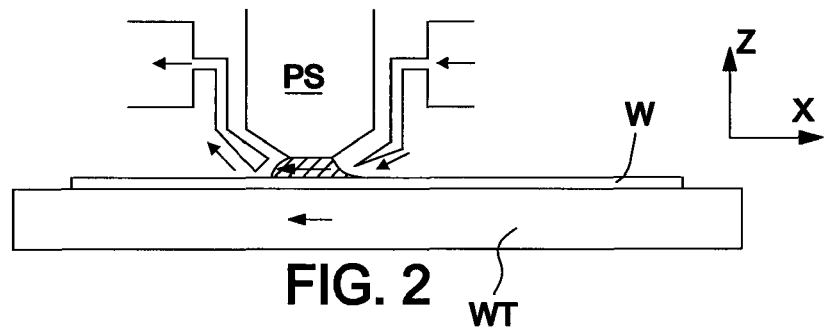
FIGS. 2 and 3 depict a liquid supply system for use in a lithographic projection apparatus.
Figure 3:
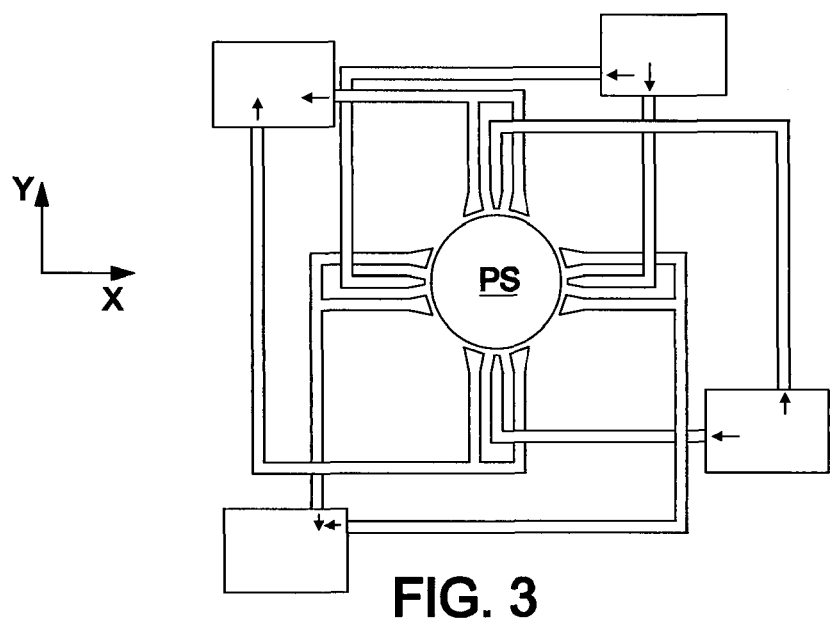

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
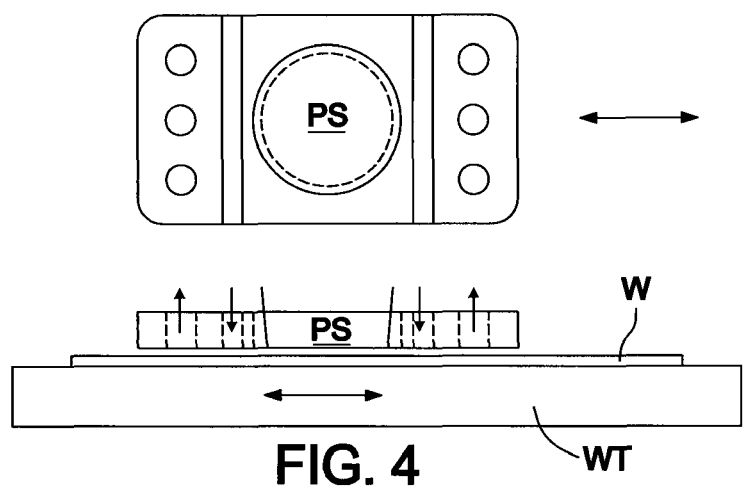
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system with a fluid handling structure 12. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air or synthetic air but, in an embodiment, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968.

Another arrangement which is possible is one which works on a gas drag principle. The so-called gas drag principle has been described, for example, in United States patent application publication no. US 2008-0212046 and U.S. patent application No. 61/071,621 filed on 8 May 2008. In that system the extraction holes are arranged in a shape which desirably has a corner. The corner may be aligned with the stepping or scanning directions. This reduces the force on the meniscus between two openings in the surface of the fluid handling structure for a given speed in the step or scan direction compared to if the two outlets were aligned perpendicular to the direction of scan.

Also disclosed in US 2008-0212046 is a gas knife positioned radially outside the main liquid retrieval feature. The gas knife traps any liquid which gets past the main liquid retrieval feature. Such a gas knife may be present in a so called gas drag principle arrangement (as disclosed in US 2008-0212046), in a single or two phase extractor arrangement (such as disclosed in US-2009-0262318-A1) or any other arrangement.

Many other types of liquid supply system are possible. Embodiments of the present invention are not limited to any particular type of liquid supply system, nor to immersion lithography. An embodiment of the invention can be applied equally in any lithography.

A control system or controller 500 controls the overall operations of the lithographic apparatus and in particular performs an optimization process described further below. Control system 500 may be embodied as a suitably-programmed general purpose computer comprising a central processing unit, volatile and non-volatile storage units, input and output devices such as keyboards and screens, connections to networks and interfaces to the various parts of the lithographic apparatus. It will be appreciated that a one-to-one relationship between controlling computer and lithographic apparatus is not necessary. In an embodiment of the invention one computer may control multiple lithographic apparatus. In another embodiment of the invention, multiple networked computers may be used to control one lithographic apparatus. The control system 500 may be configured to control also associated process devices and substrate handling devices in a lithocell or cluster of which the lithographic apparatus forms a part. The control system 500 can also be configured to be subordinate to a supervisory control system of a lithocell or cluster and/or an overall control system of a fab.

FIG. 6 depicts a control theory diagram of a control scheme according to an embodiment of the invention. The control scheme is performed by a positioning system according to an embodiment of the invention. In an embodiment, control system 500 controls the positioning system according to the control scheme. The positioning system is for controlling a relative position between a first (e.g. superior) component and a second (e.g. an inferior) component of a lithographic apparatus. The position of each component may be defined by a set of orthogonal coordinates.

The positioning system comprises a measuring device 61 configured to determine an error $e_{WT}$ in the momentary position $x_{WS}$ of one of the components with respect to a set point position r in a measurement coordinate. The positioning system further comprises a controller 62 configured to control movement of the other component in a control coordinate based on the determined error $e_{WT}$. The measurement coordinate is different from the control coordinate.

The purpose of this is that the movement of the other component in a particular direction or rotational direction can take into account the positional error of one of the components in a different direction or rotational direction. This improves the accuracy of the control of the movement of the components relative to each other by taking into account more pieces of information when controlling movement of the components in their various coordinates.

The second (e.g. inferior) component and the first (e.g. superior) component of the lithographic apparatus may be any two components in the lithographic apparatus for which it is desired to control their relative movement. In an embodiment of the invention, the second (e.g. inferior) component is a substrate table WT and the first (e.g. superior) component is the support structure MT. For convenience, embodiments of the invention will be described below in terms of the substrate table WT and the support structure MT. However, it is to be understood that the invention is not limited to the substrate table WT and the support structure MT unless explicitly stated.

In an embodiment, the components define substantially parallel x-y planes. The measurement coordinate and the control coordinate are one of the x, y and z directions.

According to known systems, a feed-through force on the support structure MT based on a determined error in the position of the substrate table WT is implemented independently for the x, y and z directions. For example, the positional error of the substrate table WT in the x direction is used to determine a feed-through force acting on the support structure MT in the x direction.

An embodiment of the present invention involves cross terms between positional error of the substrate table WT in one direction or rotational direction and movement of the support structure MT in a different direction or rotational direction.

In an embodiment, the measurement direction in which the error is determined by the measuring device 61 is the z direction. The effects of the feed-through forces acting on the support structure MT become more critical when the error in the position of the substrate table WT in the z direction is taken into account. For example, some parasitic torque occurs on the support structure MT in response to the z direction feed-through. This causes positional errors of the support structure MT in the x and y directions. In an embodiment of the present invention addresses this problem by including feed-through force components acting on the support structure MT in the x and y directions based on positional errors of the substrate table WT in the z direction.

In an embodiment, the measurement coordinate and/or the control coordinate is a coordinate indicating tilt of the substrate table WT about one of the x, y and z axes. The overall position and orientation of the substrate table WT may be described not only in terms of x, y and z directions, but also by the tilt of the substrate table WT about each of these axes. The tilt of the substrate table WT can affect the positional error of the support structure MT. According to an embodiment of the present invention, these effects can be taken into account by feed-through force components acting on the support structure MT in the x, y and z directions and in the tilt rotational directions depending on the tilt of the substrate table WT.

The measuring device 61 may be configured to determine the error in each coordinate of the set of orthogonal coordinates. The controller 62 may be configured to control, in each coordinate, the movement of the support structure MT based on the determined error $e_{WT}$ in at least one of the other coordinates. In the case that all three Cartesian coordinates and all three tilt directions are taken into account, the movement and orientation of the support structure MT may be controlled by the controller 62 in each of these six coordinates. The controller 62 may control the movement of the support structure MT in each coordinate based on the six determined errors (one for each coordinate) of the substrate table WT.

FIG. 6 depicts a three by three matrix 63 indicating feed-through force coefficients acting on the support structure MT in each of the x, y and z directions, wherein each force component is based on determined positional errors $e_{WT}$ of the substrate table WT in each of the x, y and z directions. This matrix 63 may be expanded to a six by six matrix if the tilt direction are also taken into account. Hence, the coordinates may comprise a six-dimensional coordinate system comprising a three-dimensional Cartesian coordinate system, and three coordinates indicating tilt of the substrate table WT and support structure MT about each of the Cartesian axes.

The positioning system may comprise a multiple-input and multiple-output (MIMO) system configured to communicate the determined errors $e_{WT}$ in each coordinate between the measurement device 61 and the controller 62. The signal lines may carry information about multiple directions or rotational directions instead of only one direction. The matrix 63 relates the forces as calculated by an error compensator 65 to actual forces on the support structure MT.

In an embodiment, the positioning system comprises a multiple-input and multiple-output system configured to communicate the determined errors in each coordinate between the measurement device and the controller.

The top loop of the diagram of FIG. 6 represents the control of the support structure MT. The lithographic apparatus may comprise a support structure controller $C_{MT}$ and a mechanical transfer $H_{MT}$. The mechanical transfer $H_{MT}$ represents the transfer function of the force that is applied to move the support structure MT to its position $x_{MT}$. The feed-through force based on the positional error $e_{WT}$ of the substrate table WT is calculated by the error compensator 65 and combined with the force determined by the sub-controller $C_{MT}$ based on the feed-back of the positional error $e_{MT}$ of the support structure MT. The positional error $e_{MT}$ of the support structure MT is calculated by the difference between the momentary position $x_{MT}$ of the support structure MT and a support structure set point position equal to 4 times r, indicating that the support structure MT moves four times as much as the substrate table WT due to the magnification factor of the projection optics.

The bottom loop shown in the diagram of FIG. 6 is the control of the substrate table WT. The substrate table control loop may comprise a substrate table controller $C_{WT}$ and a mechanical transfer $H_{WT}$.

The support structure receives a set point 4r, which is four times the set point r of the substrate table WT, while its output only counts ¼ in the relevant relative error $e_{wr}$. This reflects the fact that the pattern image is projected by the projection system PS with a magnification factor of M=¼ and that the support structure MT scans at four times the speed of the substrate table WT.

It is to be noted that in this description, the magnification factor is taken to be 4, which is a current industry standard. However, embodiments of the present invention are in no way dependent on the magnification factor. Hence, where in the drawings the number 4 is used, this may be substituted by any other number, depending on the magnification factor of the lithographic apparatus.

The positioning system may comprise a set point generator (not shown) configured to generate a substrate table set point position r for the substrate table WT and to generate a support structure set point position 4r for the support structure MT. The substrate table set point position r differs from the support structure set point position 4r by the magnification factor such that movement of the substrate table WT and the support structure MT differ by the magnification factor. The positioning system may comprise separate setpoint generators for generating the setpoints for the support structure MT and for the substrate table WT. In this case, the separate setpoint generators are configured to generate the setpoints such that the positional relation between the substrate table WT and the support structure MT matches the magnification ratio of the projection system during the exposure process.

In an embodiment, the setpoint generator is configured to generate sequential setpoint positions for one of the components, wherein the controller is configured to control movement of the other of said components based on the determined error and a subsequent setpoint position.

High acceleration of the support structure MT, caused in part by high feed-through forces from the substrate table WT to the support structure MT, can lead to streaking problems for dense or isolated imaging structures and overlay. These feed-through forces may be for example up to 15N, and can be caused by resonances in the substrate table WT or its connection to encoder heads for example at a frequency above 3 kHz. These high feed-through forces can cause resonances in other components of the lithographic apparatus, such as the connection of the patterning device (e.g. mask) MA on the support structure MT, leading to the above-mentioned problems.

The feed-through forces can excite the eigenfrequencies of the support structure MT. This can result in imaging errors. Furthermore, large peak forces during acceleration can cause slip of the patterning device MA.

In order to reduce the streaking and overlay problems, a filter may be applied to the error signal from the substrate table WT and/or to the compensatory control signal calculated from the determined error $e_{WT}$. For example, FIG. 6 depicts a filter $H_{FC}$ applied to the error signal fed through from the substrate table WT. FIG. 6 also depicts another filter $H_{FF}$ which is applied to the compensatory control signal that is added to the feed-back loop for the support structure MT.

Figure 7:
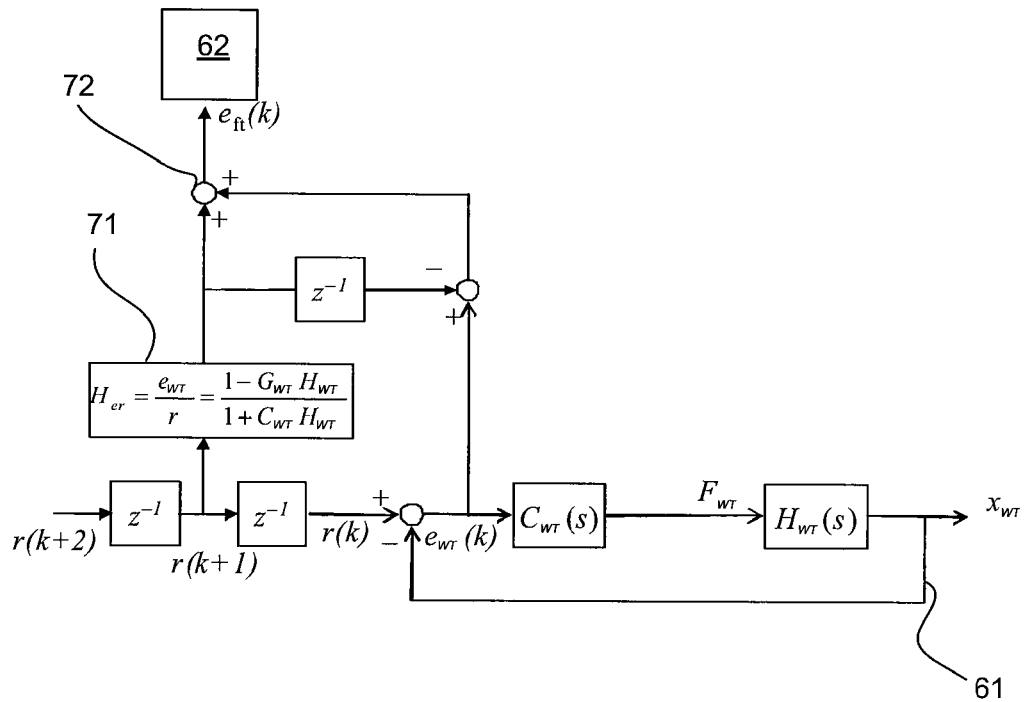
FIG. 7 is a control theory circuit according to an embodiment of the invention.

FIG. 7 depicts a control theory diagram of a control scheme according to an embodiment of the invention. The control scheme is performed by a positioning system according to an embodiment of the invention. In an embodiment, control system 500 (depicted in FIG. 1) controls the positioning system according to the control scheme. The positioning system is for controlling a relative position between the support structure MT and the substrate table WT of a lithographic apparatus.

The positioning system comprises a set point generator configured to generate sequential set point positions r(k) for the substrate table WT. The positioning system further comprises a measuring device 61 configured to determine an error $e_{WT}$ in the momentary position of the substrate table WT with respect to the momentary set point position r(k). The positioning system further comprises a controller 62 configured to control movement of the support structure MT based on the determined error $e_{WT}$ and a subsequent set point position r(k+1).

The purpose of this is that the positional error of the substrate table WT that results from its set point r may be fed through to the controller 62 earlier. This allows the time lag in the reaction of the support structure MT to the positional error $e_{WT}$ of the substrate table WT to be compensated.

The subsequent set point position may be the immediately subsequent set point position r(k+1). Alternatively, the time lag may correspond to a high number of setpoint samples such that a further subsequent value of the set point position may be used such as r(k+2) or r(k+3), where k represents the sample number in the series of setpoints.

The time lag in the reaction of the support structure MT to the positional error $e_{WT}$ of the substrate table WT is partly due to the time required for the calculations of the force that is to be applied to the support structure MT based on the error signal that is fed through from the substrate table WT. For this reason a set point compensator 64 is comprised in the control system depicted in FIG. 6. By use of the set point compensator 64, an earlier set point position of the substrate table WT may be provided to adjust the set point position of the support structure MT. For example, the setpoint position for the support structure MT may be adjusted based on an error signal of the substrate table that is two setpoint samples later than the sample from which the compensatory control signal for adjusting the force applied to the support structure is calculated. Preferably, in an embodiment, the time lag from the input of the setpoint compensator 64 to its output matches the time lag introduced by the error compensator 65, the response of $H_{MT}$ to this, and possible other delays in the system. This time lag may be for example two samples.

The positional error of the substrate table WT may be considered to comprise two components, namely one component that is generated by the set point r and a component that is not generated by the set point r. The component that is generated by the set point r is especially important for the positional error of the substrate table WT in the z direction. During an exposure procedure, the substrate table moves in the z direction to keep the non-flat substrate W in the focal plain of the projection optics. The set point r fed to the substrate table WT is dictated by the level of the substrate W, which is not constant.

The response of the positional error $e_{WT}$ of the substrate table WT due to leveling operations performed on the substrate table WT can be predicted because the relationship between the setpoint position r and the ensuing error is known to a great extent. Hence, by knowing the setpoint samples that will be fed to the substrate table WT (which are usually known a number of samples in advance), the positional error of the substrate table WT can be predicted a few samples in advance.

An embodiment of the present invention as depicted in FIG. 7 is an improvement over known systems in that the component of the positional error $e_{WT}$ resulting from the setpoint r can be fed to the controller 62 one or more samples in advance, thereby reducing the time lag in the reaction of the support structure MT to the positional error $e_{WT}$ of the substrate table WT.

The positioning system may further comprise an error predictor 71 configured to predict a subsequent error in the subsequent position of the substrate table WT with respect to the subsequent setpoint position r(k+1). The controller 62 is configured to move the support structure MT based on the determined error $e_{WT}$ and the predicted subsequent error. The predicted subsequent error is output by the error predictor 71.

The positioning system may comprise a feed-forward error calculator 72 configured to calculate a feed-forward error $e_{FT}$ by combining the predicted subsequent error and the determined error $e_{WT}$. The controller 62 is configured to control movement of the support structure MT based on the feed-forward error $e_{FT}$. The feed-through error $e_{FT}$ then takes the place of the error signal that is fed to the filter $H_{FC}$ in FIG. 6.

The error generated by the set point r may be calculated from the following expression, $e_{WT}=H_{er}r$. $H_{er}$ is known to a great extent and can be implemented in software to predict the substrate table error $e_{WT}$ as a function of the set point r.

The real occurring error may be fed to the substrate table MT but excluding the component of the error generated by the set point r that has already been predicted. The feed-through error $e_{FT}$ may be calculated as follows, $e_{FT}(k)=e_{WT}(k)+(1-z^{-1})H_{er}r(k+1)$.

According to the embodiment depicted in FIG. 7, the support structure MT can be controlled by the controller 62 to respond more quickly to positional errors of the substrate table WT.

According to an embodiment, there is provided a positioning system for controlling a relative position between a first (e.g. superior) component and a second (e.g. an inferior) component of a lithographic apparatus comprising a setpoint generator configured to generate sequential setpoint positions for one of the components, a measuring device configured to determine an error in the momentary position of said one of the components with respect to the momentary setpoint position and a controller configured to control movement of the other of said components based on the determined error and a subsequent setpoint position.

In an embodiment of the positioning system, the components define substantially parallel x-y planes and the measuring device is configured to determine said error in the z direction.

In an embodiment, the positioning system comprises an error predictor configured to predict a subsequent error in the subsequent position of said one of the components with respect to the subsequent setpoint position wherein the controller is configured to move said other of said components based on the determined error and the predicted subsequent error.

In an embodiment, the positioning system further comprises a feed-forward error calculator configured to calculate a feed-forward error by combining the predicted subsequent error and the determined error wherein the controller is configured to control movement of the other component based on the feed-forward error.

In an embodiment, the measuring device of the positioning system is a compensatory measuring device configured to determine a compensated error in the momentary position of one of the components with respect to a setpoint position wherein the compensated error excludes from the actual error an error component due to at least one frequency component of movement of the one of the second (e.g. inferior) component and first (e.g. superior) component and wherein the positioning system further comprises an uncompensatory measuring device configured to determine an uncompensated error in the momentary position of the one of the components with respect to said setpoint position wherein the uncompensated error includes said error component due to said at least one frequency component of movement of the one of the second (e.g. inferior) component and first (e.g. superior component).

Figure 8:
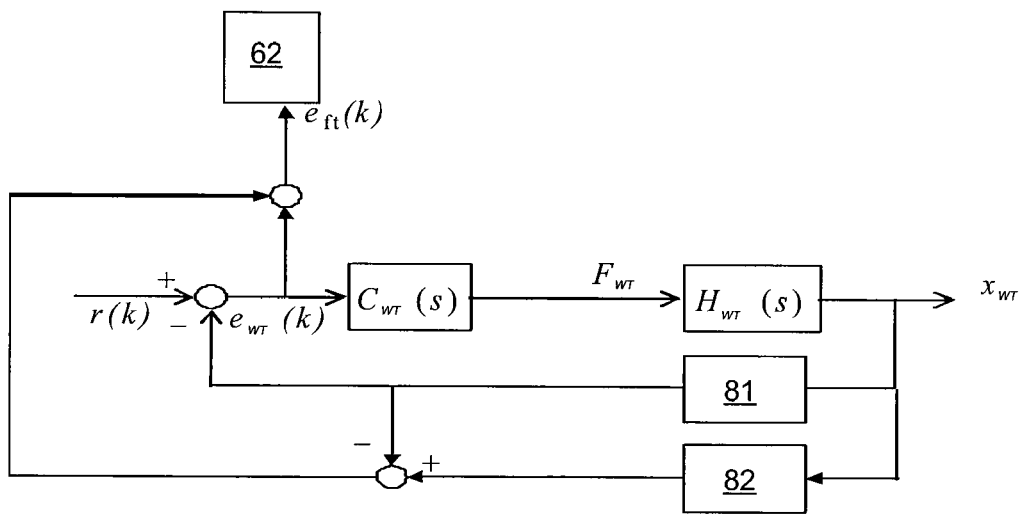
FIG. 8 is a control theory circuit according to an embodiment of the invention.

FIG. 8 is a control theory diagram of a control scheme according to an embodiment of the invention. The control scheme is performed by a positioning system according to an embodiment of the invention. In an embodiment, control system 500 (depicted in FIG. 1) controls the positioning system according to the control scheme. The positioning system is for controlling a relative position between the support structure MT and the substrate table WT of the lithographic apparatus. The positioning system comprises a compensatory measuring device configured to determine a compensated error $e_{WT}$ in the momentary position of the substrate table WT with respect to a setpoint position r. Measuring device 81 measures a compensated momentary position of the substrate table WT. The measured compensated momentary position is compared with a setpoint position r to determine the compensated error $e_{WT}$. The compensated error $e_{WT}$ excludes from the actual error an error component due to at least one frequency component of movement of the substrate table WT.

The positioning system further comprises an uncompensatory measuring device configured to determine an uncompensated error in the momentary position of the substrate table WT with respect to the setpoint position r. Measuring device 82 is configured to measure the uncompensated momentary position of the substrate table WT. The uncompensated momentary position of the substrate table WT is compared with the compensated momentary position of the substrate table WT measured by measuring device 81. The result of the comparison represents the positional component due to the at least one frequency component of movement of the substrate table WT. This component is added to the compensated error $e_{WT}$ to determine the uncompensated error. The uncompensated error includes the error component due to the at least one frequency component of movement of the substrate table WT.

The at least one frequency component may correspond to a torsion mode of the substrate table WT. The determination of compensated error, for example torsion mode compensation, largely removes the torsion mode from the measured position of the substrate table WT in at least the z direction.

For example, measuring device 81 may be configured to measure the compensated position of the substrate table WT by measuring the compensated position at a part of substrate table WT that is a node of the torsion mode (or whichever mode of movement corresponds to the at least one frequency component). Alternatively, measuring device 81 transforms position measurements of the substrate table WT to a point that is at a node of the torsion mode. Of course, the invention is not restricted to compensation of the torsion mode. Other modes may also be compensated for.

Measuring device 81 may determine the position of the substrate table WT in the z direction at a torsion mode frequency at the center of the substrate W, rather than from the position directly underneath the final element of the projection system PS. The purpose of this is to eliminate the torsion mode from the measurement. This is effective because the center of the substrate table WT is a node of the torsion mode.

The purpose of eliminating the torsion mode is that if the torsion mode is taken into account, then there can be servo stability problems for the positional control of the substrate table WT. It is very difficult to control the movement of the substrate table WT at high frequencies to take into account its movement due to the torsion mode. The substrate table WT has dynamic properties that result in resonances at specific frequencies. If the frequency of the resonance is too high, as is the case for the torsion mode, then this resonance cannot be compensated for by the substrate table controller $C_{WT}$.

In contrast, the movement of the support structure MT is driven at least in part by a feed-through signal provided by controller 62 and does not rely wholly on the support structure controller $C_{MT}$. Therefore high frequencies, such as the torsion mode at for example 650 Hz to 800 Hz, which cannot be compensated for by the substrate table controller $C_{WT}$ may be at least partly compensated for by the controller 62.

For this reason, it is desirable to calculate also the actual position of the substrate table WT directly under the final element of the projection system PS. This is done by the uncompensatory measuring device 82. Accordingly, it is possible to calculate additionally the z position under the lens (as the substrate W experiences it) and feed the difference with the z position as used by the substrate table controller $C_{WT}$ to the support structure MT. In this way, the servo stability issues of the substrate table controller $C_{WT}$ are avoided, while the support structure MT can track the difference between the actual error and the compensated error, thereby compensating for the torsion mode. This is depicted in FIG. 8. In an embodiment, the uncompensated error is transmitted directly from the measuring device 82 to be used as the feed-through error $e_{FT}$. This is because $e_{FT}$ represents the difference between the setpoint position r and the output of the measuring device 82. Hence, $e_{FT}$ equals the uncompensated positional error of the substrate table WT.

The encoder heads of the substrate table WT can perform the measurement of the z position of the substrate table WT. A different transformation is used by the compensatory measuring device 81 compared with the uncompensatory measuring device 82. The measuring device 82 may be configured to measure the uncompensated position of the substrate table WT at a part of the substrate table that is not a node of the torsion mode (or other mode of movement corresponding to the at least one frequency component).

In an embodiment of the positioning system, the compensatory measuring device is configured to determine the compensated error by measuring the compensated error at a part of the one of the components that is a node of a mode of movement corresponding to the at least one frequency component.

In an embodiment, the positioning system comprises an uncompensatory measuring device configured to determine the uncompensated error by measuring the uncompensated error at a part of the one of the components that is not a node of a mode of movement corresponding to the at least one frequency component.

In an embodiment, the positioning system further comprises a measuring device configured to determine a momentary error in the momentary position of one of the components with respect to a momentary setpoint position, a relative error measuring device configured to determine a relative error between a momentary position of the one of the components and a momentary position of the other of the components, a variable gain controller configured to gain control the momentary error based on the determined relative error a controller configured to control movement of the other of the components based on the gain controlled momentary error.

Figure 9:
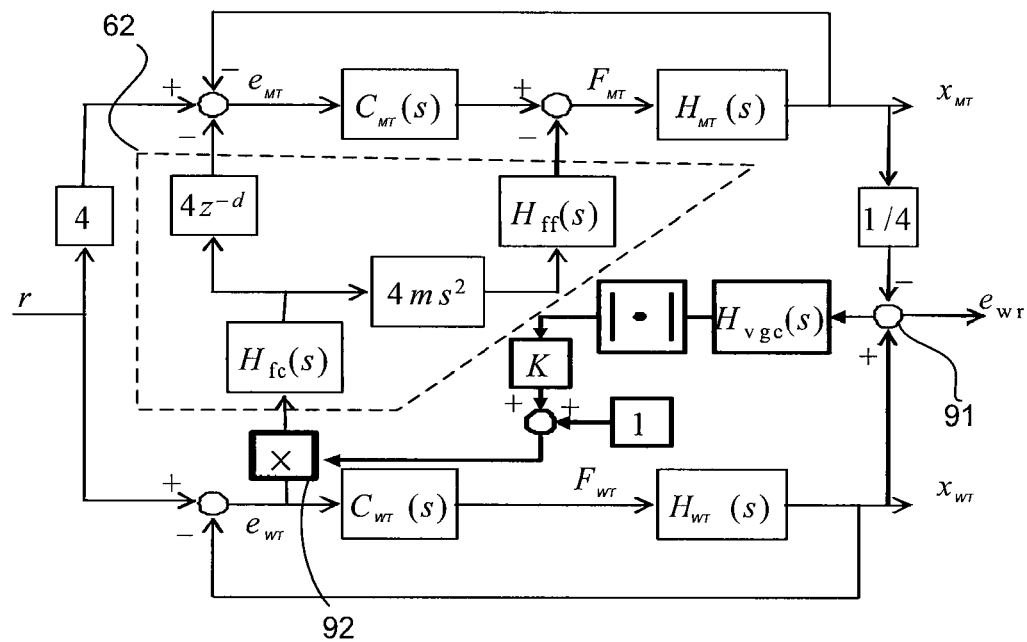
FIG. 9 is a control theory circuit according to an embodiment of the invention.

FIG. 9 is a control theory diagram of a control scheme according to an embodiment of the invention. The control scheme is performed by a positioning system according to an embodiment of the invention. In an embodiment, control system 500 (depicted in FIG. 1) controls the positioning system according to the control scheme. The positioning system comprises a relative error measuring device 91 configured to determine a relative error $e_{WR}$ between a momentary position of the substrate table WT and a momentary position of the support structure MT. The controller 62 is configured to control movement of the support structure MT based on the determined relative error $e_{WR}$.

The purpose of this is that the relative error between the positions of the support structure MT and the substrate table WT is more important than the absolute error in the position of either of these with respect to the setpoint r or 4r.

The positioning system may further comprise a measuring device 61 configured to determine a momentary error in the momentary position of the substrate table WT with respect to a momentary setpoint position r. This measuring device 61 is as described above in relation to FIGS. 6, 7 and 8. The controller 62 is configured to control movement of the support structure MT based on the determined relative error $e_{WR}$ and the determined momentary error $e_{WT}$.

In an embodiment, the positioning system comprises a variable gain controller 92 configured to determine an error gain X based on the determined relative error $e_{WR}$, and to adjust the determined momentary error $e_{WT}$ based on the determined error gain X. Hence, the feed-through gain may be increased when the relative error $e_{WR}$ between the positions of the substrate table WT and the support structure MT is large. This drives the relative error $e_{WR}$ to zero more rapidly. Preferably, a filter $H_{VGC}$ is provided in order to create the correct phase behaviour between the relative error $e_{WR}$ and the determined momentary error $e_{WT}$.

As depicted in FIG. 9, the variable gain control may involve determining the absolute value of the filtered relative error $e_{WR}$. Then, the absolute value of the filtered relative error may be multiplied by a factor K in order to account for the fact that the relative error is in the order of nanometers, and hence does not give a proper indication of a gain value. Once multiplied by the factor K, the resulting value may be increased by 1 in order to ensure that the gain is at least 1, such that the variable gain controller 92 acts to increase the feed-through error, rather than decrease it. The measuring device 91 may be configured to measure the difference between the positional errors of the support structure MT and the substrate table WT, rather than their absolute values.

According to an embodiment, there is provided a positioning system for controlling a relative position between a first (e.g. superior) component and a second (e.g. an inferior) component of a lithographic apparatus, the positioning system comprising a measuring device configured to determine a momentary error in the momentary position of one of the components with respect to a momentary setpoint position, a relative error measuring device configured to determine a relative error between a momentary position of the one of the components and a momentary position of the other of the components, a variable gain controller configured to gain control the momentary error based on the determined relative error and a controller configured to control movement of the other of the components based on the gain controlled momentary error.

In an embodiment of the positioning system, the variable gain controller is configured to filter the determined relative error and to calculate an absolute value of the filtered relative error.

In an embodiment of the positioning system, the variable gain controller is configured to add one to the absolute value of the filtered relative error and to multiply the resulting value by a multiplication factor, thereby to calculate an error gain value for gain control of the momentary error.

In an embodiment, the positioning system comprises a measuring device configured to determine an error in the momentary position of one of the components with respect to a setpoint position wherein the controller is configured to control movement of the other of the components based on a third or higher order derivative of the determined error.

Figure 10:
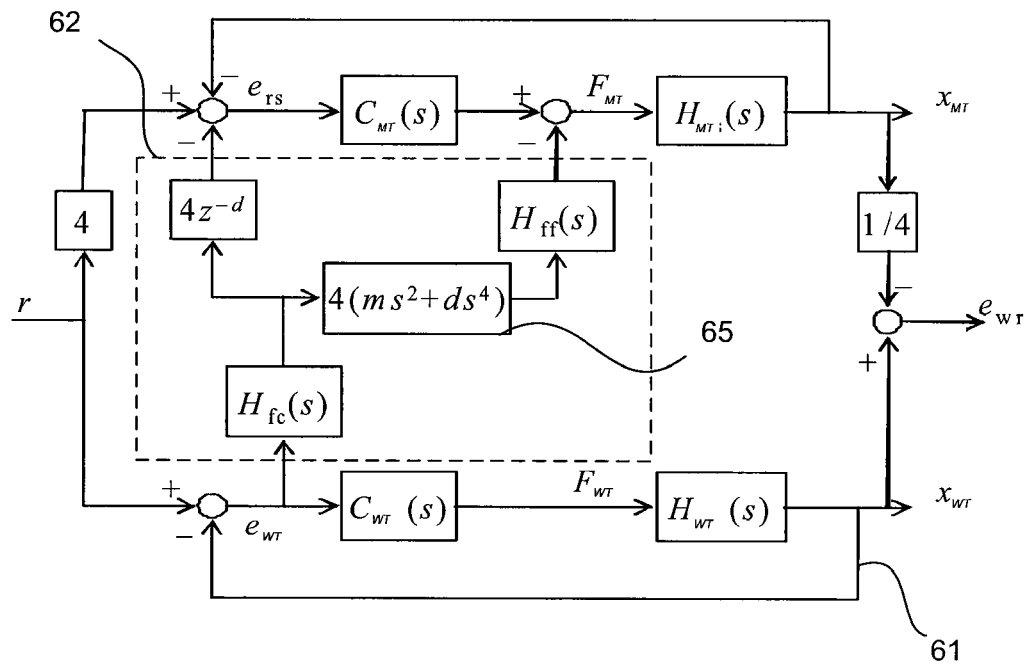
FIG. 10 is a control theory circuit according to an embodiment of the invention.

FIG. 10 is a control theory diagram of a control scheme according to an embodiment of the invention. The control scheme is performed by a positioning system according to an embodiment of the invention. In an embodiment, control system 500 controls the positioning system according to the control scheme. The positioning system is for controlling a relative position between the support structure MT and the substrate table WT of a lithographic apparatus. The positioning system comprises a measuring device 61 configured to determine an error in the momentary position of the substrate table WT with respect to a setpoint position r. The positioning system further comprises a controller 62 configured to control movement of the support structure MT based on a third or higher order derivative of the determined error. In an embodiment, the controller 62 is configured to control movement of the support structure MT based on a fourth or higher order derivative of the determined error.

An error compensator 65 may approximate the inverse of the support structure transfer function $H_{MT}$ by calculating the second order derivative of the determined error and multiplying by the mass of the support structure MT. This is shown, for example, in FIG. 6 in which the error compensator 65 is shown to calculate 4 ms². According to an embodiment of the invention, a "snap" term $ds^4$ is also included in the calculation performed by the error compensator 65, where s represents a derivative order of the determined error.

As a result, the feed-through force can be more effective for higher frequencies where the dynamic properties of the support structure MT become more important. Other orders of derivatives of the determined error may also be used.

According to an embodiment, there is provided a positioning system for controlling a relative position between a first (e.g. superior) component and a second (e.g. an inferior)

component of a lithographic apparatus comprising a measuring device configured to determine an error in the momentary position of one of the components with respect to a setpoint position and a controller configured to control movement of the other of the components based on a third or higher order derivative of the determined error.

In an embodiment of the positioning system, the controller is configured to control movement of the other of the components based on a fourth or higher order derivative of the determined error.

In an embodiment, the positioning system comprises a measuring device configured to determine an error in the momentary position of one of the components with respect to a setpoint position, an error compensator configured to generate a compensatory control signal for controlling movement of the other of the components based on the determined error and a limiter configured to limit the compensatory control signal wherein the controller is configured to control movement of the other of the components based on the limited compensatory control signal.

Figure 11:
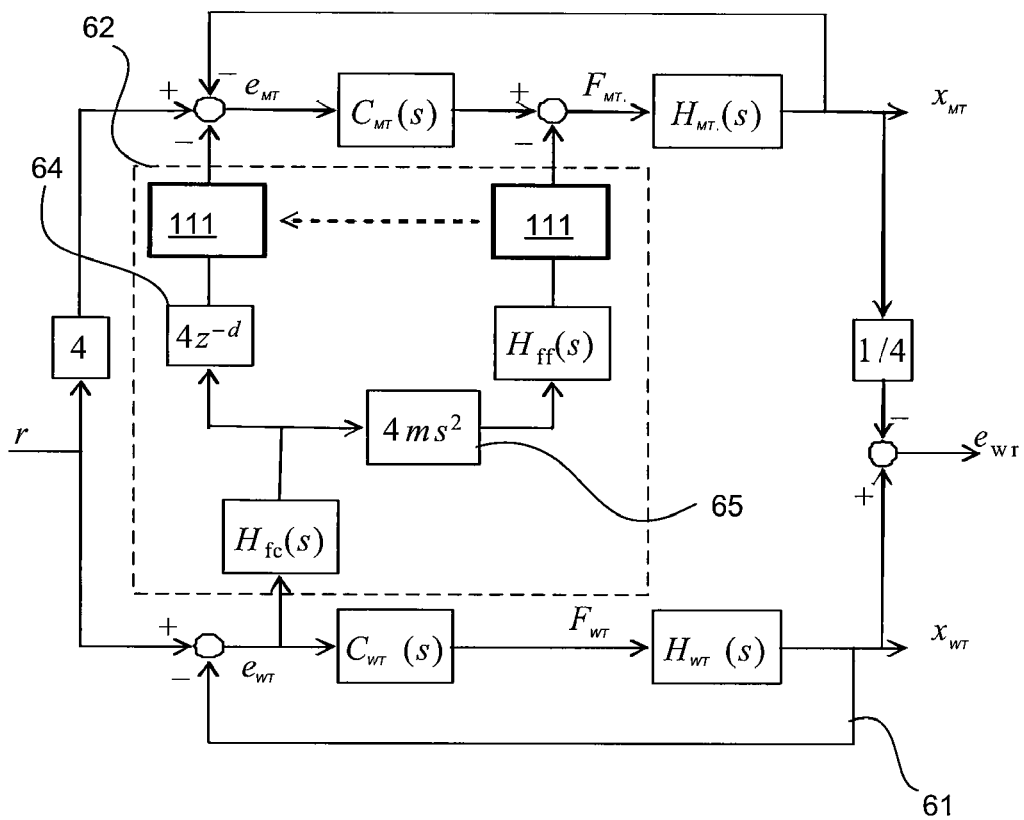
FIG. 11 is a control theory circuit according to an embodiment of the invention.

FIG. 11 is a control theory diagram of a control scheme according to an embodiment of the invention. The control scheme is performed by a positioning system according to an embodiment of the invention. In an embodiment, control system 500 controls the positioning system according to the control scheme. The positioning system is for controlling a relative position between the support structure MT and the substrate table WT of a lithographic apparatus. The positioning system comprises a measuring device 61 configured to determine an error in the momentary position of the substrate table WT with respect to a setpoint position r, and an error compensator 65 configured to generate a compensatory control signal for controlling movement of the support structure MT based on the determined error $e_{WT}$. The error in the momentary position of the substrate table WT is determined by measuring the position of the substrate table WT and comparing the measured position with the setpoint position r. The positioning system further comprises a limiter 111 configured to limit the compensatory control signal, and a controller 62 configured to control movement of the support structure MT based on the limited compensatory control signal.

By use of the limiter 111, the peak values of the feed-through error and forces can be limited. In an embodiment, this limiting is performed after the compensatory control signal has been calculated by the error compensator 65 and filtered by filter $H_{FF}$. In this way, the limiting action itself will not cause any dynamic transient effects in these filters.

The filter internal states may be changed only gradually in order to prevent "ringing" as will be described in further detail below with respect to FIG. 13.

In an embodiment, two limiters are provided, one for each fork of the feed-through path to the support structure MT. One of the limiters 111 may be positioned after the output of the setpoint compensator 64, with the other limiter provided after the output of the filter $H_{FF}$ which filters the output of the error compensator 65. In an embodiment, both limiters are substantially the same. The limiters 111 may be in communication with each other in order to ensure that the setpoint adjustment matches the feed-through force adjustment.

In an embodiment, only one limiter 111 is provided. In this case, the limiter 111 may be provided directly before or directly after the filter $H_{FC}$. However, this may cause "ringing" of the feed-through filters. The limiter may be configured to limit the compensatory control signal by clipping, or by saturation for example.

The limiter 111 may be configured to limit the compensatory control signal based on a movement of the substrate table and/or the support structure MT. In particular, the limiter may be configured to limit based on a scanning status of the support structure and/or the substrate table WT.

According to an embodiment, there is provided a positioning system for controlling a relative position between a first (e.g. superior) component and a second (e.g. an inferior) component of a lithographic apparatus comprising a measuring device configured to determine an error in the momentary position of one of the components with respect to a setpoint position, an error compensator configured to generate a compensatory control signal for controlling movement of the other of the components based on the determined error, a limiter configured to limit the compensatory control signal and a controller configured to control movement of the other of the components based on the limited compensatory control signal.

In an embodiment of the positioning system, the limiter is configured to limit the compensatory control signal based on a movement of the second (e.g. inferior) component and/or the first (e.g. superior) component.

In an embodiment of the positioning system, the error compensator is configured to generate the compensatory control signal by calculating a second or higher order derivative of the determined error.

In embodiment of the positioning system, the limiter is configured to limit the compensatory control signal by clipping.

In an embodiment of the positioning system, the first (e.g. superior) component is a support structure constructed to support a patterning device, the second (e.g. inferior) component is a substrate table constructed to hold a substrate and the limiter is configured to limit the compensatory control signal based on a scanning status of the support structure and/or the substrate table.

In an embodiment of the positioning system, the limiter is configured to limit the compensatory control signal by limiting the signal to zero outside of a scanning operation.

In an embodiment of the positioning system, the limiter is configured to limit the compensatory control signal by gradually increasing the signal from zero immediately preceding a scanning operation.

In an embodiment of the positioning system, the limiter is configured to limit the compensatory control signal by gradually decreasing the signal to zero immediately after a scanning operation.

In an embodiment of the positioning system, the limiter is configured to limit the compensatory control signal based on an acceleration state of the first (e.g. inferior) component and/or the second (e.g. superior) component.

In an embodiment, the positioning system further comprises a setpoint generator configured to generate a second (e.g. an inferior) component setpoint position for the second (e.g. inferior) component and to generate a first (e.g. superior) component setpoint position for the first (e.g. superior) component, wherein the second (e.g. inferior) component setpoint position differs from the first (e.g. superior) component setpoint position by a magnification factor such that movements of the second (e.g. inferior) component and the first (e.g. superior) component differ by the magnification factor.

In an embodiment, the positioning system comprises an error compensator configured to generate a compensatory control signal for controlling movement of the other of the components based on the determined error and a setpoint compensator configured to generate a compensatory setpoint signal for adjusting the first (e.g. superior) component setpoint position based on the determined error.

In an embodiment of the positioning system, the first (e.g. superior) component is a support structure constructed to support a patterning device and the second (e.g. inferior) component is a substrate table constructed to hold a substrate below the support structure.

Figure 12:
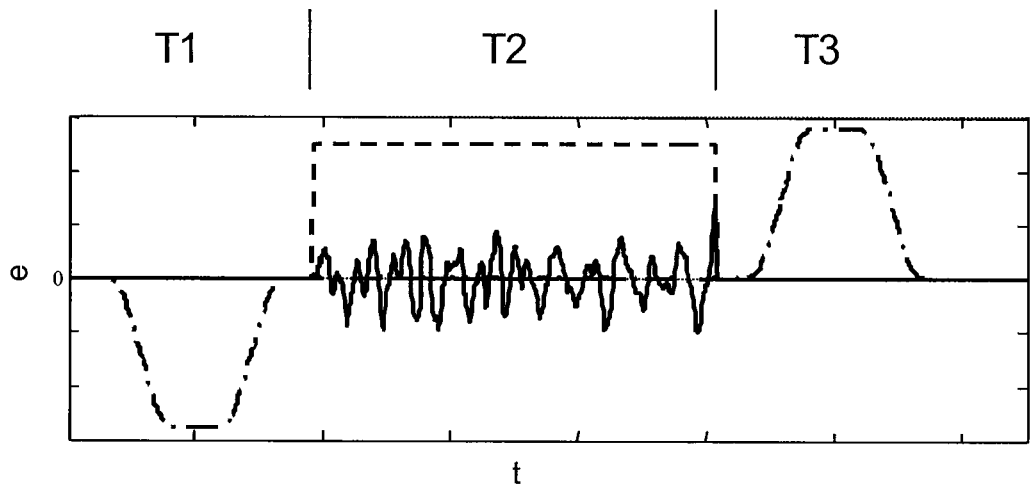
FIG. 12 depicts the feed-through force and resulting error according to an embodiment of the invention.

FIG. 12 depicts the feed-through force and resulting error according to an embodiment of the invention. As depicted in FIG. 12, the feed-through forces are switched on and are thus effective only during a scanning operation. Hence, the limiter 111 is configured to limit the compensatory control signal by limiting the signal to zero outside of a scanning operation. The limiter 111 may be connected to the sync bus controller of the lithographic apparatus, which provides information of whether or not a scanning operation is in process.

Figure 13:
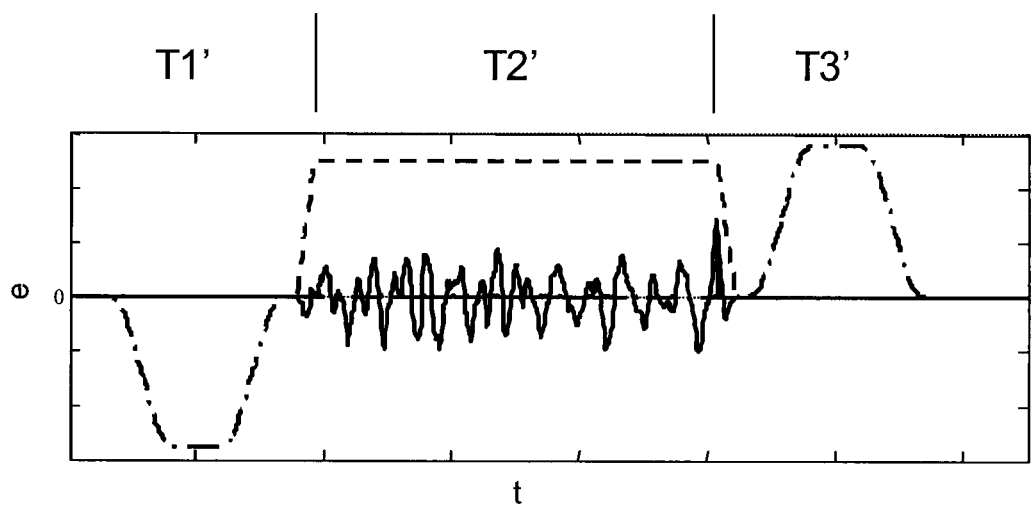
FIG. 13 depicts the feed-through force and resulting error according to an embodiment of the invention.
Figure 14:
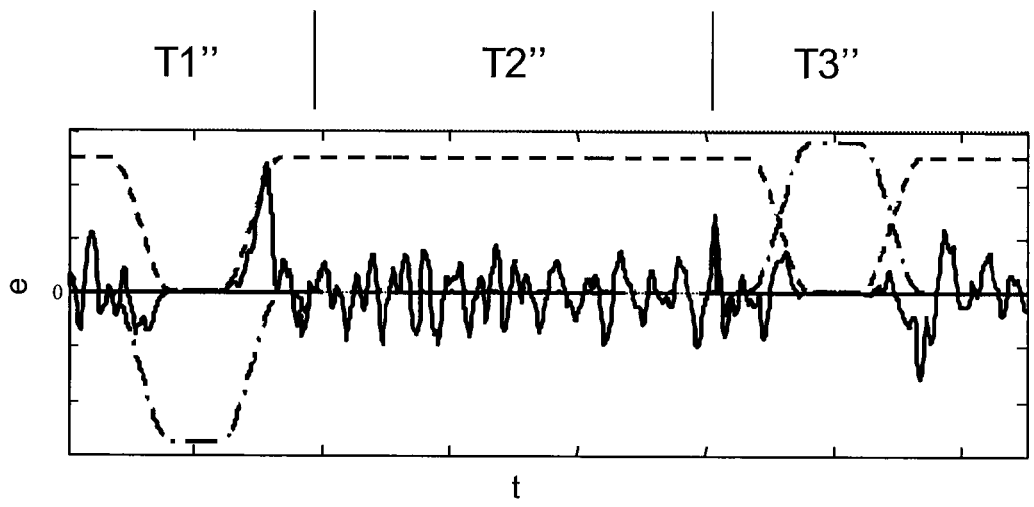
FIG. 14 depicts the feed-through force and resulting error according to an embodiment of the invention.

In FIGS. 12 to 14, the solid graph line represents positional error due to the feed-through forces, the regular broken line represents the weighting of the feed-through forces (i.e. where the regular broken line is at zero, the feed-through force is off), and the dot-chain line represents the acceleration profile of the substrate table WT and support structure MT.

As depicted in FIG. 12, the error feed-through force is zero outside of the scanning period, namely during periods T1 and T3. During the scanning period, namely T2, the error due to the feed-through forces is non-zero.

By controlling the feed-through force system such that it is active only during a scanning period, the feed-through error peaks are reduced. The peak feed-through forces are also reduced. This method in particular produces a large reduction of the component of the feed-through forces that is caused by errors during the acceleration phase of the scanning motion.

However, as can be seen in FIG. 12, there is a sharp cut off of the feed-through force error in the transitional periods from T1 to T2 and from T2 to T3. This can cause "ringing" of the support structure MT positional error. The "ringing" is due to a sudden change in an input signal and causes errors in the control of the component.

FIG. 13 depicts the feed-through force and resulting error according to an embodiment of the invention. FIG. 13 corresponds to the embodiment depicted in FIG. 11 in which the limiter 111 is configured to limit the compensatory control signal by gradually increasing the signal from zero immediately preceding a scanning operation. This is shown in FIG. 13 by the presence of a reduced but non-zero error in the transitional time period between T1' and T2', and by the slanted regular broken line.

Desirably, the limiter 111 is configured to limit the compensatory control signal by gradually decreasing the signal to zero immediately after a scanning operation. This is shown by the reduced but non-zero error in the transitional period between T2' and T3', and by the slanted regular broken line.

As with the method of limiting depicted in FIG. 12, the method depicted in FIG. 13 results in a large reduction of the feed-through peak errors during a scanning operation (although not quite such a large reduction as with the method depicted in FIG. 12). There is smoothing of the positional error outside of the scanning period T2'. With this method, there is a large reduction of the feed-through peak forces. The smoothing of the error before and after the scanning period T2' reduces the undesirable "ringing" effect.

FIG. 14 depicts feed-through force and resulting error according to an embodiment of the invention. In this embodiment, the limiter 111 is configured to limit the compensatory control signal based on an acceleration state of the substrate table WT and/or the support structure MT. In particular, the level of the feed-through force may be weighted depending on the acceleration of the substrate table WT and/or the support structure MT. When the acceleration is zero, the feed-through force is set to 100%. When the acceleration is maximum, the feed-through force is zero. The feed-through force is weighted depending on the level of acceleration between these two extremes.

The method depicted in FIG. 14 has the effect of reducing the feed-through peak errors during acceleration. The peak feed-through forces are also reduced, although not as much as with the methods depicted in FIGS. 12 and 13.

In an embodiment, the positioning system comprises an error compensator 65 configured to generate a compensatory control signal for controlling movement of the support structure MT based on the determined error, and a setpoint compensator 64 configured to generate a compensatory setpoint signal for adjusting the support structure setpoint position based on the determined error.

In an embodiment of the invention, a lithographic apparatus comprises a support structure MT, a substrate table WT and a positioning system comprising the above described measuring device 61 and the above described controller 62 configured to control movement of the support structure MT based on the determined error $e_{WT}$. The support structure MT and the substrate table WT define substantially parallel x-y planes. The measuring device 61 is configured to determine an error $e_{WT}$ in the momentary position of the substrate table WT with respect to a setpoint position r in the z direction. In known systems a feed-through force may be applied in x and y directions. The present invention provides good results from the feed-through forces for correcting the relative position of the support structure MT and the substrate table WT by using also the z direction.

In an embodiment, the controller 62 is configured to control movement of the support structure in the z direction based on the determined error. This is to compensate for the relative z positions of the support structure MT and substrate table WT. Of course, cross terms for controlling the x and y directional movements of the support structure MT depending on the z direction error of the substrate table WT can also be used, as described above. The magnification factor may be different for different directions. In particular, the magnification factor may be different in the z direction compared to the x and y directions. For example, depending on the type of the projection optics, the magnification factor in the z direction may be quadratically larger, e.g. 16.

According to an embodiment, there is provided a lithographic apparatus comprising a support structure constructed to support a patterning device, a substrate table constructed to hold a substrate and a positioning system for controlling a relative position between the support structure and the substrate table, wherein the support structure and the substrate table define substantially parallel x-y planes, the positioning system comprising a measuring device configured to determine an error in the momentary position of the substrate table with respect to a setpoint position in the z direction and a controller configured to control movement of the support structure based on the determined error.

In an embodiment of the lithographic apparatus, the controller is configured to control movement of the support structure in the z direction based on the determined error.

According to an embodiment, there is provided a method for controlling a relative position between a first (e.g. superior) component and a second (e.g. an inferior) component of a lithographic apparatus, the method comprising generating sequential setpoint positions for one of the components, determining an error in the momentary position of the one of the components with respect to the momentary setpoint position and controlling movement of the other of the components based on the determined error and a subsequent setpoint position.

According to an embodiment, there is provided a method for controlling a relative position between a first (e.g. superior) component and a second (e.g. an inferior) component of a lithographic apparatus comprising determining a momentary error in the momentary position of one of the components with respect to a momentary setpoint position, determining a relative error between a momentary position of the one of the components and a momentary position of the other of the components, gain controlling the momentary error based on the determined relative error and controlling movement of the other of the components based on the gain controlled momentary error.

According to an embodiment, there is provided a method for controlling a relative position between a first (e.g. superior) component and a second (e.g. an inferior) component of a lithographic apparatus comprising determining an error in the momentary position of one of the components with respect to a setpoint position and controlling movement of the other of the components based on a third or higher order derivative of the determined error.

According to an embodiment, there is provided a method for controlling a relative position between a first (e.g. superior) component and a second (e.g. an inferior) component of a lithographic apparatus comprising determining an error in the momentary position of one of the components with respect to a setpoint position, generating a compensatory control signal for controlling movement of the other of the components based on the determined error, limiting the compensatory control signal and controlling movement of the other of the components based on the limited compensatory control signal.

According to an embodiment, there is provided a method for controlling a relative position between a support structure constructed to support a patterning device and a substrate table constructed to hold a substrate of a lithographic apparatus, wherein the support structure and the substrate table define substantially parallel x-y planes, comprising determining an error in the momentary position of the substrate table with respect to a setpoint position in the z direction and controlling movement of the support structure based on the determined error.

As will be appreciated, any of the above described features can be used with any other feature and it is not only those combinations explicitly described which are covered in this application. For example, the limiters 111 as shown in FIG. 11 can be applied in all other control schemes described above and depicted in FIGS. 6 to 10. In another embodiment, the second (e.g. inferior) component may e.g. relate to an active lens or mirror subsystem that is coupled to the lens system PS and that is (preferably) controlled in six degrees of freedom. In such an embodiment the error of the first (e.g. superior) component may be given as a position setpoint and/or acceleration setpoint to the lens or mirror subsystem. This may be beneficial as the lens or mirror subsystem is relatively lightweight and compact compared with the first (e.g. superior) component resulting in higher internal frequencies and thus in higher control servo bandwidths.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A positioning system for controlling a relative position between a first component and a second component of a lithographic apparatus, wherein a position of each component is defined by a set of orthogonal coordinates, the positioning system comprising:
   a measuring device configured to determine an error in the momentary position of one of the components with respect to a setpoint position in a measurement coordinate; and
   a controller configured to control movement of the other component in a control coordinate based on the determined error;
   wherein the measurement coordinate is different from the control coordinate, and
   wherein the measurement coordinate is associated with a first direction or a first rotational direction and the control coordinate is associated with a second direction or a second rotational direction that is different from the first direction or the first rotational direction.

2. The positioning system of claim 1, wherein:
   the components define substantially parallel x-y planes; and
   each of the measurement coordinate and the control coordinate is associated with one of the x, y and z directions.

3. The positioning system of claim 1, wherein the components define substantially parallel x-y planes and the measurement coordinate is associated with the z direction.

4. The positioning system of claim 1, wherein:
   the components define substantially parallel x-y planes; and
   the measurement coordinate and/or the control coordinate is a coordinate indicating tilt of the component about one of the x, y and z axes.

5. The positioning system of claim 1, wherein:
   the measuring device is configured to determine the error in each coordinate of the set of orthogonal coordinates; and
   the controller is configured to control, in each coordinate, the movement of the other component based on the determined error in at least one of the other coordinates.

6. The positioning system of claim 1, wherein the coordinates comprise a six-dimensional coordinate system comprising a three-dimensional Cartesian coordinate system, wherein the components define substantially parallel x-y planes, and three coordinates indicating tilt of the components about each of the Cartesian axes.

7. A lithographic apparatus comprising:
   a support structure constructed to support a patterning device;
   a substrate table constructed to hold a substrate; and
   the positioning system of claim 1;
   wherein the first component is the support structure and the second component is the substrate table.

8. The lithographic apparatus of claim 7, wherein the positioning system comprises a measuring device configured to determine an error in the momentary position of the substrate table with respect to a setpoint position in the z direction.

9. A method for controlling a relative position between a first component and a second component of a lithographic apparatus, wherein a position of each component is defined by a set of orthogonal coordinates, the method comprising:
   determining an error in the momentary position of one of the components with respect to a setpoint position in a measurement coordinate; and
   controlling movement of the other component in a control coordinate based on the determined error;
   wherein the measurement coordinate is different from the control coordinate, and
   wherein the measurement coordinate is associated with a first direction or a first rotational direction and the control coordinate is associated with a second direction or a second rotational direction that is different from the first direction or the first rotational direction.

* * * * *